(12) United States Patent  
Vranken

(10) Patent No.: US 8,281,197 B2  
(45) Date of Patent: Oct. 2, 2012

(54) INTEGRATED CIRCUIT TEST METHOD AND TEST APPARATUS

(75) Inventor: Hendrikus Petrus Elisabeth Vranken, Weert (NL)

(73) Assignee: NXP B.V., Eindhoven (NL)

( * ) Notice: Subject to any disclaimer, the term of this patent is extended or adjusted under 35 U.S.C. 154(b) by 705 days.

(21) Appl. No.: 12/092,186

(22) PCT Filed: Oct. 23, 2006

(86) PCT No.: PCT/IB2006/053889  
§ 371 (c)(1),  
(2), (4) Date: Sep. 12, 2008

(87) PCT Pub. No.: WO2007/069098  
PCT Pub. Date: Jun. 21, 2007

(65) Prior Publication Data  
US 2009/0077439 A1    Mar. 19, 2009

(30) Foreign Application Priority Data  
Nov. 4, 2005  (EP) .................................. 05110387

(51) Int. Cl.  
*G01R 31/28* (2006.01)

(52) U.S. Cl. .......................................... 714/732; 714/741

(58) Field of Classification Search .................. 714/728, 714/729, 732, 742, 724, 736, 739, 741; 702/185  
See application file for complete search history.

(56) References Cited

U.S. PATENT DOCUMENTS

| | | | |
|---|---|---|---|
| 4,194,113 A * | 3/1980 | Fulks et al. ................... | 714/732 |
| 5,475,694 A | 12/1995 | Ivanov et al. | |
| 6,347,395 B1 | 2/2002 | Payne et al. | |
| 6,476,076 B1 | 11/2002 | Lee et al. | |
| 6,681,357 B2 * | 1/2004 | Pendurkar ..................... | 714/732 |
| 6,971,054 B2 * | 11/2005 | Kurtulik et al. ............... | 714/732 |
| 7,007,213 B2 * | 2/2006 | Wang et al. ................... | 714/729 |
| 7,246,277 B2 * | 7/2007 | Lukanc ......................... | 714/718 |
| 7,437,640 B2 * | 10/2008 | Rajski et al. .................. | 714/729 |

(Continued)

FOREIGN PATENT DOCUMENTS

CN    1342138 A    3/2002

(Continued)

OTHER PUBLICATIONS

Chen, Wang; et al "On Compacting Test Response Data Containing Unknown Values" IEEE/ACM International Conference on Computer Aided Design. ICCAD 2003. IEEE/ACM Digest of Technical Papers, November 9, 2003, pp. 855-862.

(Continued)

*Primary Examiner* — David Ton

(57) ABSTRACT

A method (200) for locating a fault in an integrated circuit (100) having a plurality of digital outputs coupled to compaction logic (140) in a test mode of the integrated circuit, the compaction logic comprising at least one output for providing a test response is disclosed. The method comprises the steps of: providing a simulation model of the integrated circuit (210); providing the simulation model with a plurality of test patterns (220); receiving a plurality of simulated test responses to said test patterns (230); defining a plurality of bits in the plurality of responses, said bits defining a signature of the fault (240); providing the integrated circuit with a further plurality of test patterns (250); receiving a plurality of test responses to said further plurality of test patterns (260); and checking the plurality of responses for the presence of the signature (270). This method provides improved fault detectability for an IC subjected thereto.

20 Claims, 3 Drawing Sheets

U.S. PATENT DOCUMENTS

| | | | |
|---|---|---|---|
| 7,487,420 B2 * | 2/2009 | Keller | 714/732 |
| 7,509,550 B2 * | 3/2009 | Rajski et al. | 714/732 |
| 7,509,551 B2 * | 3/2009 | Koenemann et al. | 714/732 |
| 7,552,373 B2 * | 6/2009 | Wang et al. | 714/729 |
| 7,865,794 B2 * | 1/2011 | Rajski et al. | 714/739 |
| 7,987,442 B2 * | 7/2011 | Rajski et al. | 716/136 |
| 2003/0120988 A1 | 6/2003 | Rajski et al. | |
| 2005/0138509 A1 | 6/2005 | Kiryu et al. | |
| 2006/0020860 A1 * | 1/2006 | Tardif et al. | 714/724 |
| 2006/0041812 A1 * | 2/2006 | Rajski et al. | 714/742 |
| 2006/0041814 A1 * | 2/2006 | Rajski et al. | 714/742 |
| 2007/0100586 A1 * | 5/2007 | Cheng et al. | 702/185 |
| 2009/0177933 A1 * | 7/2009 | Rajski et al. | 714/728 |

FOREIGN PATENT DOCUMENTS

| | | |
|---|---|---|
| CN | 1460923 A | 12/2003 |
| CN | 1548974 A | 11/2004 |
| JP | 62-159246 | 7/1987 |
| JP | 04-264276 | 9/1992 |
| JP | 06-103101 | 4/1994 |
| JP | 11-174126 | 7/1999 |
| JP | 11-202026 | 7/1999 |
| JP | 2000-137061 A | 5/2000 |
| JP | 2001-273160 A | 10/2001 |
| JP | 2002-267719 A | 9/2002 |
| WO | 2005031378 A1 | 3/2005 |

OTHER PUBLICATIONS

Sinanoglu, O; et al "Parity-Based Output Compaction for Core-Based SOCs" The 8th IEEE European Test Workshop 2003. Proceedings, May 2003, pp. 15-20.

* cited by examiner

INTEGRATED CIRCUIT TEST METHOD AND TEST APPARATUS

The present invention relates to a method for locating a fault in an integrated circuit (IC) having a plurality of digital outputs coupled to compaction logic in a test mode of the integrated circuit, the compaction logic comprising at least one output for providing a test response.

The present invention further relates to a test apparatus implementing such a method.

IC testing is rapidly becoming a dominating factor in the manufacturing costs of ICs. One of the main reasons for this is that for complex ICs testing is time-consuming. This is mainly because large amounts of test input and output data have to be communicated with the IC under test. Consequently, measures to reduce the size of the data involved in this communication have attracted considerable attention.

For instance, test solutions have been disclosed in which digital test input data has been compacted, with the IC having an on-board extractor for restoring the test input data to its original size. Similarly, the digital test outputs of the IC under test have been compacted by an on-board compactor, and the IC test results are provided to the outside world in this compacted form. An example of this approach can be found in: "Parity-based output compaction for core-based SOCs" by Sinanoglu et al., Proc. Of the Eight IEEE European Test Workshop, pages 15-20, IEEE ETW 2003. In such approaches, each compacted test response to a test input, e.g. a test vector provided to the IC under test is analyzed to determine whether the provided test vector triggered the detection of a fault.

A drawback of using compacted test results is that test resolution may be lost, especially when using parity-tree based compactors, which are typically based on exclusive OR logic gates. Hence, the occurrence of a fault producing an even number of faulty bits on the outputs of the IC that are fed into the compactor, or the simultaneous occurrence of an even number of faults may lead to the faulty bits cancelling each other out. Also, the location of the fault may become more difficult because of fault aliasing, in which multiple faults simultaneously produce faulty bits on different outputs of the IC, which means that the compacted test response is only indicative of the occurrence of a number of faulty bits without the possibility of assigning them to a specific fault.

The present invention seeks to provide an improved method for testing an IC according to the opening paragraph.

The present invention further seeks to provide a test apparatus for implementing the improved method.

According to an aspect of the present invention, there is provided a method as claimed in claim 1. The invention is based on the realization that a fault in an IC is likely to be observable in a number of compacted test responses, because several test inputs are capable of uncovering the fault. Thus, by constantly observing the outputs of the compaction logic, i.e. collecting responses to a plurality of test patterns from these outputs, the chance that the observability of this fault is destroyed by error bit cancellation or the localizability of the fault is destroyed through fault aliasing is greatly reduced.

According to another aspect of the invention, there is provided a test apparatus as claimed in claim 6. Such a test apparatus facilitates the improved test coverage provided by the method of the present invention.

The invention is described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

Figure 1:
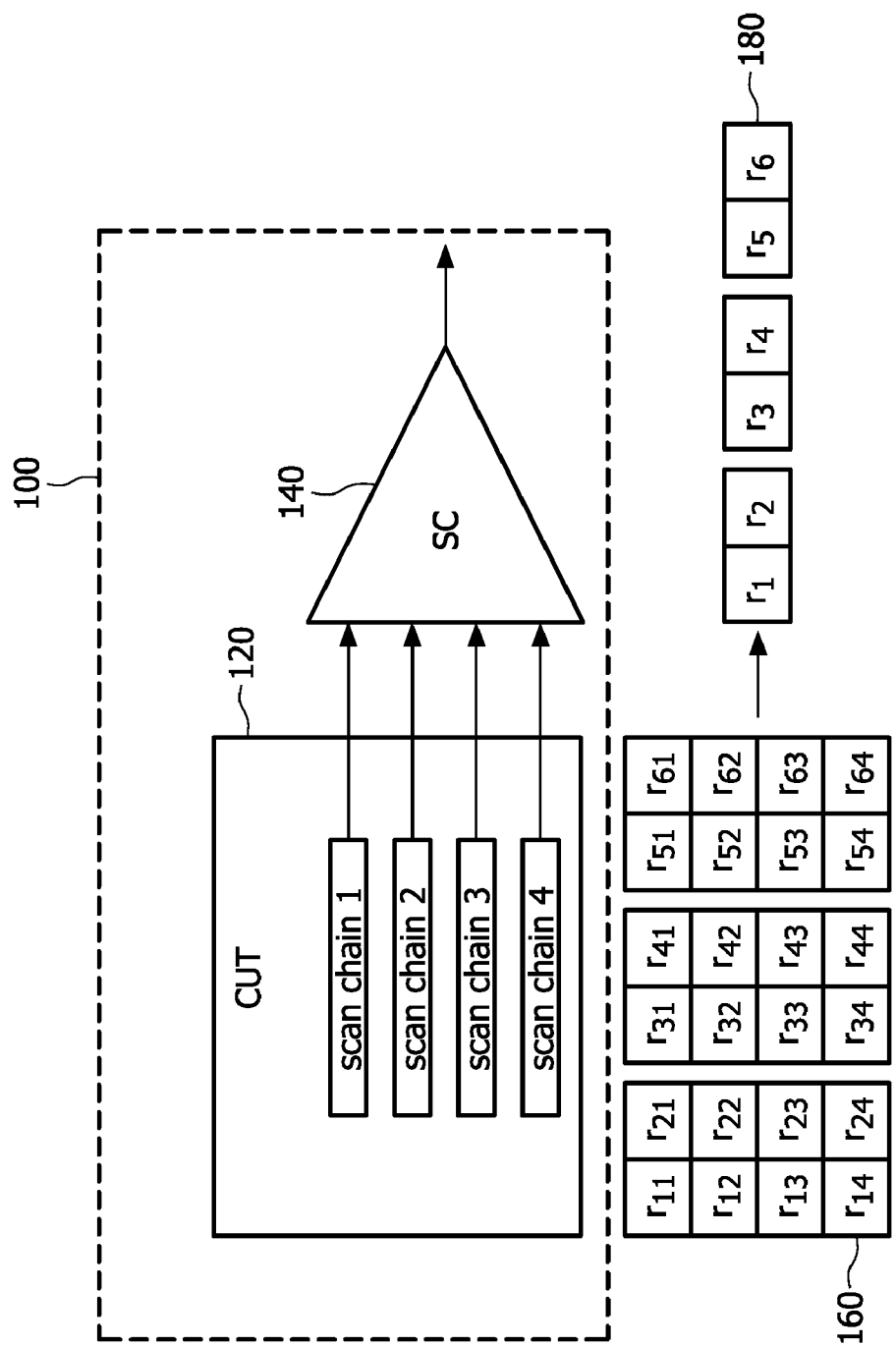
FIG. 1 depicts an IC for use with the method of the present invention.

The present invention proposes an original approach for fault diagnosis with test responses that have been compacted by space compaction logic (SCL). The key idea is to observe the SCL outputs continuously during the entire test. This exploits the fact that a defect in a circuit under test (CUT) will cause multiple fault effects that usually can be observed in multiple cycles at the scan chain outputs of the CUT in one or multiple test patterns. Most faults therefore have a unique SCL output sequence, which facilitates accurate fault detection and diagnosis. This approach differs from the aforementioned prior art approaches, in which diagnosis is based on identifying all failing scan cells in each cycle.

Definitions used in this description:

A response bit contains (part of) the test response to a test stimulus such as a test pattern or test vector. In scan-based testing, a response bit is captured in a scan flip-flop in the scan capture cycle, and is next shifted out. We define set R that contains all response bits (of all test patterns) for a given CUT.

An observation bit is a response bit in which a fault effect is observed. Set $O \subset R$ contains all observations bits (of all test patterns) for a $\overline{\text{CUT}}$.

A fault signature is a set of all observation bits $O_f \subseteq O$ in which the fault effects of a fault f are observed.

A failure set is a set of faults that all have the same fault signature. Failure set $FS_i = \{F_i, O_i\}$ consists of a set of faults $F_i$ and fault signature $O_i$ such that $\forall f \in F_i: O_f = O_i$. For a CUT with n failure sets and set F of all faults, holds that $\cup_{1 \leq i \leq n} F_i = F$, and $\cup_{1 \leq i \leq n} O_i = O$.

The sets of faults in the failure sets are unique and disjoint: $\forall FS_i = \{F_i, O_i\}, FS_j = \{F_j, O_j\}, i \neq j: F_i \cap F_j = \emptyset$.

The fault signatures in the failure sets are unique but usually not disjoint: $\forall FS_i = \{F_i, O_i\}, FS_j = \{F_j, O_j\}, i \neq j: O_i \neq O_j$. Note that $O_i \neq O_j$ implies: $(O_i \cap O_j = \emptyset) \vee (O_i \subset O_j) \vee (O_i \supset O_j) \vee (O_i \cap O_j \subset O_j)$.

FS is the set of all p failure sets of a CUT when observing fault effects at the n scan chain outputs, and $FS^{SCL}$ is the set of all q failure sets of the CUT+SCL when observing fault effects at the outputs of the SCL. It holds that $p \geq q$.

The fault coverage FC is the ratio of all faults that are detected for a given test pattern set when observing the CUT outputs. The fault coverage $FC^{SCL}$ is the ratio of all faults that are detected for a given test pattern set when observing the outputs of the SCL.

The diagnostic resolution DR is defined as the ratio of the number of failure sets observed at the SCL outputs (q) and the number of failure sets observed at the CUT outputs (p). Hence, DR=100% q/p.

Fault cancellation of failure set $FS_i = \{F_i, O_i\}$ occurs when the number of observation bits in $O_i$ at the inputs of each exclusive OR (XOR)-network of the SCL compaction network is zero or even in all cycles. Fault cancellation implies that the fault effects of all faults $f \in F_i$ cannot be observed at the SCL outputs. Hence, fault cancellation causes loss of both fault coverage and diagnostic resolution.

Fault aliasing occurs when multiple failure sets $FS_i$ at the CUT outputs result in the same failure set $FS_j^{SCL}$ at the SCL outputs. Fault aliasing does not cause fault coverage loss, but causes loss of diagnostic resolution.

Theoretical analysis shows that both fault cancellation and fault aliasing probabilities are very small when applying the method of the present invention. Both probabilities furthermore decrease drastically with increasing number of response bits.

EXAMPLE

Fault cancellation and fault aliasing are illustrated in the following example (see FIG. 1). The IC 100 comprises a circuit portion under test (CUT) 120, which contains 4 scan chains of length 2. The SCL 140 comprises a simple XOR-network with 4 inputs and 1 output. Such SCL implements a parity-tree. The test pattern set contains 3 test patterns 160. $r_{ij}$ is the response bit that is observed in cycle i at the output of scan chain j, and $r_i$ is the compacted response bit in cycle i observed at the SCL output. The set of $r_{ij}$ has been indicated in FIG. 1 as 160, and the set of $r_i$ has been indicated as 180. It will be appreciated that the dimensions of the CUT and SCL are chosen by way of non-limiting example only.

Suppose that the CUT 120 has the following failure sets:
$FS_1=\{F_1, O_1\}$, with $F_1=\{f_1\}$ and $O_1=\{r_{11}, r_{13}, r_{32}, r_{33}\}$;
$FS_2=\{F_2, O_2\}$, with $F_2=\{f_2, f_3, f_4\}$ and $O_2=\{r_{12}, r_{43}, r_{64}\}$;
$FS_3=\{F_3, O_3\}$, with $F_3=\{f_5, f_6\}$ and $O_3=\{r_{11}, r_{41}, r_{63}\}$;
$FS_4=\{F_4, O_4\}$, with $F_4=\{f_7, f_8, f_9\}$ and $O_4=\{r_{21}, r_{52}, r_{53}\}$; and
$FS_5=\{F_5, O_5\}$, with $F_5=\{f_{10}\}$ and $O_5=\{r_{22}, r_{63}\}$.
Fault cancellation occurs for $FS_1$, since $O_1$ has two observation bits in cycle 1 and 3. Fault aliasing occurs for $FS_2$ and $FS_3$, since their observation bits appear in the same cycles. The failure sets at the output of the parity tree 140 are:
$FS_1^{SCL}=\{F_2 \cup F_3, \{r_1, r_4, r_6\}\}$,
$FS_2^{SCL}=\{F_4, \{r_2\}\}$, and
$FS_3^{SCL}=\{F_5, \{r_2, r_6\}\}$.
Hence, at the SCL 140 output only 9 out of 10 faults can be observed, and the number of failure sets is reduced from 5 to 3. The relative fault coverage $FC^{SCLrel}$ therefore is 100%·9/10=90%, and the diagnostic resolution DR is 100%·3/5=60%.

Generating Failure Sets

An automated test pattern generation (ATPG) tool (not shown) creates a fault dictionary of all target faults and generates test patterns to detect these faults. The fault coverage can be derived easily by means of fault simulation, and expresses the percentage of detected faults out of the target faults. The failure sets can be derived by fault simulation of all test patterns without fault dropping. In this way, all observation bits in all test patterns are identified for each fault. The random-testable faults are usually detected by many test patterns, and hence the number of observation bits for such faults can grow very large. The storage requirements for the failure sets may therefore become excessive for large circuits and can easily take several Gigabytes. A practical way for reducing this data volume is to introduce a fault isolation limit, such that the maximum number of observation bits in each failure set does not exceed this limit. During fault simulation, a fault is now dropped after it has been detected by the number of observation bits as specified by the fault isolation limit, thus providing an upper limit for the number of bits in the signature of the fault. The fault isolation limit should not be chosen too small, since this would reduce the number of failure sets and hence reduce the diagnostic resolution. Practical values for the fault isolation limit are in the range of a few hundreds.

Preferably, the failure sets are generated for stuck-at faults. Although actual defects rarely behave as stuck-at faults, matching the failing responses of a defective circuit with such failure sets often allows identifying a small number of candidate defect locations that can be resolved further by physical failure analysis.

At this point, it is emphasized that the values of some test responses cannot be determined a priori, while other test responses may be tri-stated or unreliable. These unknown, tri-stated, and unreliable test responses, referred to as 'X' test responses, cause that reliable compaction of test responses becomes very difficult or even impossible. SCL is relatively insensitive to X's, although the SCL output sequence becomes less useful if X's show up in many cycles. As a solution to this problem, X-masking logic (XML, not shown) in front of the compaction logic 140 may be used to mask all X's before the responses are compacted. An example of such XML is for instance described in PCT application WO2005/031378. In this application, it is demonstrated that he XML transforms all 'X' test responses into fixed, known responses.

The X-masking logic can also be used to reduce fault cancellation. Fault cancellation occurs in case an even number of observation bits appears at the inputs of each XOR-tree in the same cycle. By masking one or more of the observation bits, the number of observation bits can be transformed from even to odd, and now the fault effect can be observed at the SCL outputs. Bit masking should be applied with care, since each observation bit is usually contained in multiple failure sets. Hence, repairing fault cancellation for one failure set may cause fault cancellation for other failure sets, while also fault aliasing may occur. For each failure set suffering from fault cancellation, we therefore for instance mask only one observation bit that is used least often in other failure sets.

Fault cancellation can also be reduced by ATPG tool enhancements. After generating each pattern, fault simulation of the CUT 120 plus SCL 140 should be performed. In case of fault cancellation, the cancelled fault should be considered as undetected and targeted by ATPG in subsequent patterns.

Preferably, the ATPG tool should be instructed to sensitize each fault to an odd number of observation bits, which causes that at least in one cycle an odd number of observation bits appears at the inputs of the SCL.

Fault aliasing is more difficult to repair, since fault aliasing can only be analysed after all patterns have been generated. Nevertheless, bit masking can also be applied to reduce fault aliasing. In case of aliasing of two failure sets, an observation bit can be masked that appears in only one of the failure sets. The ATPG tool can be used to generate additional patterns to resolve fault aliasing, although this increases pattern count.

Figure 2:
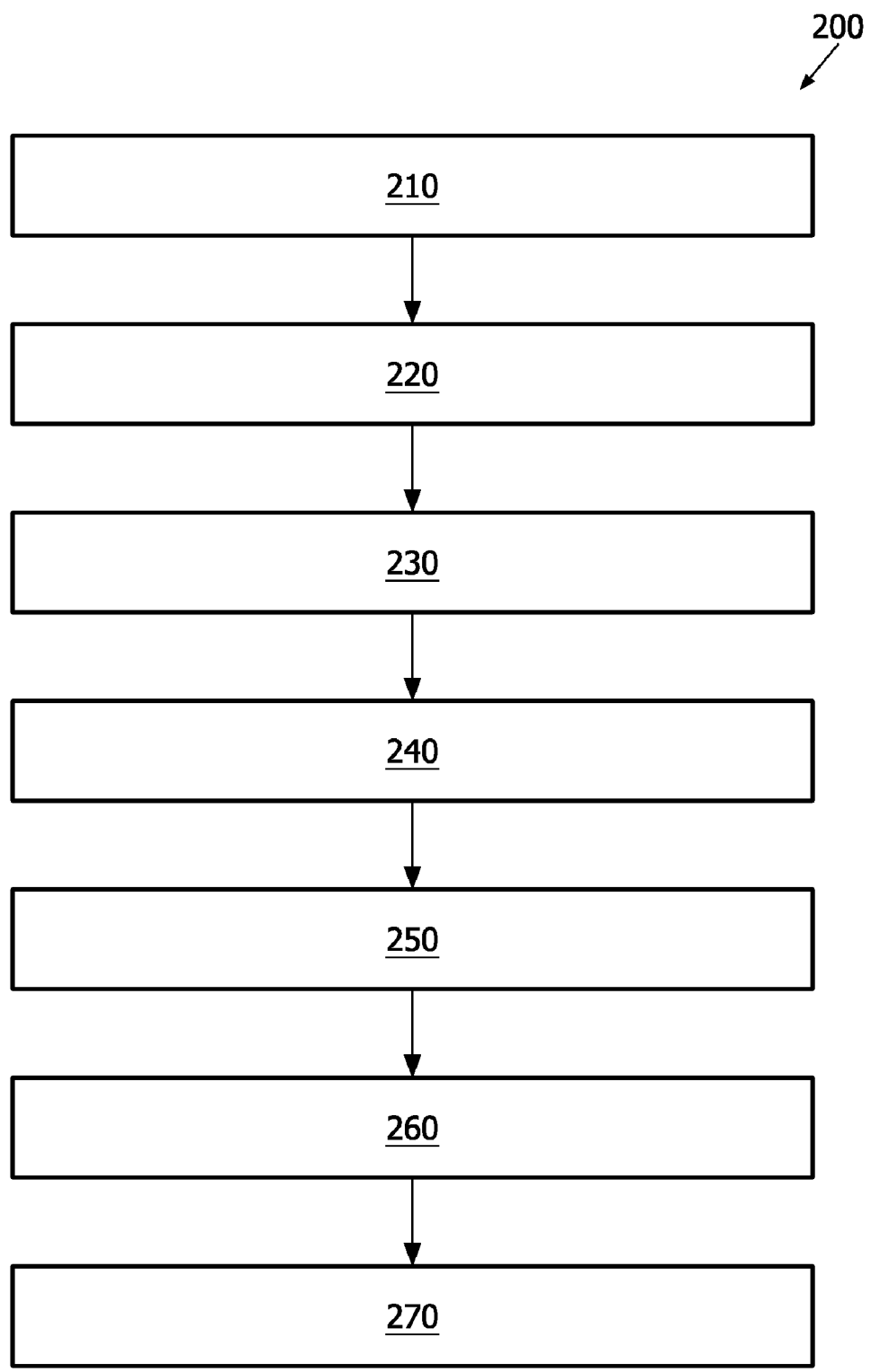
FIG. 2 depicts a flowchart of the method of the present invention.

FIG. 2 shows a flowchart of the method 200 of the present invention. In step 210, a simulation model of the integrated circuit is provided. This can be achieved with well-known simulation tools. Subsequently, in step 220, the simulation model is provided with a plurality of test patterns, and in step 230, the simulation model generates a plurality of simulated test responses to said test patterns.

Next, in step 240, a plurality of bits in the plurality of responses that define a signature of the fault are identified as previously explained.

Figure 3:
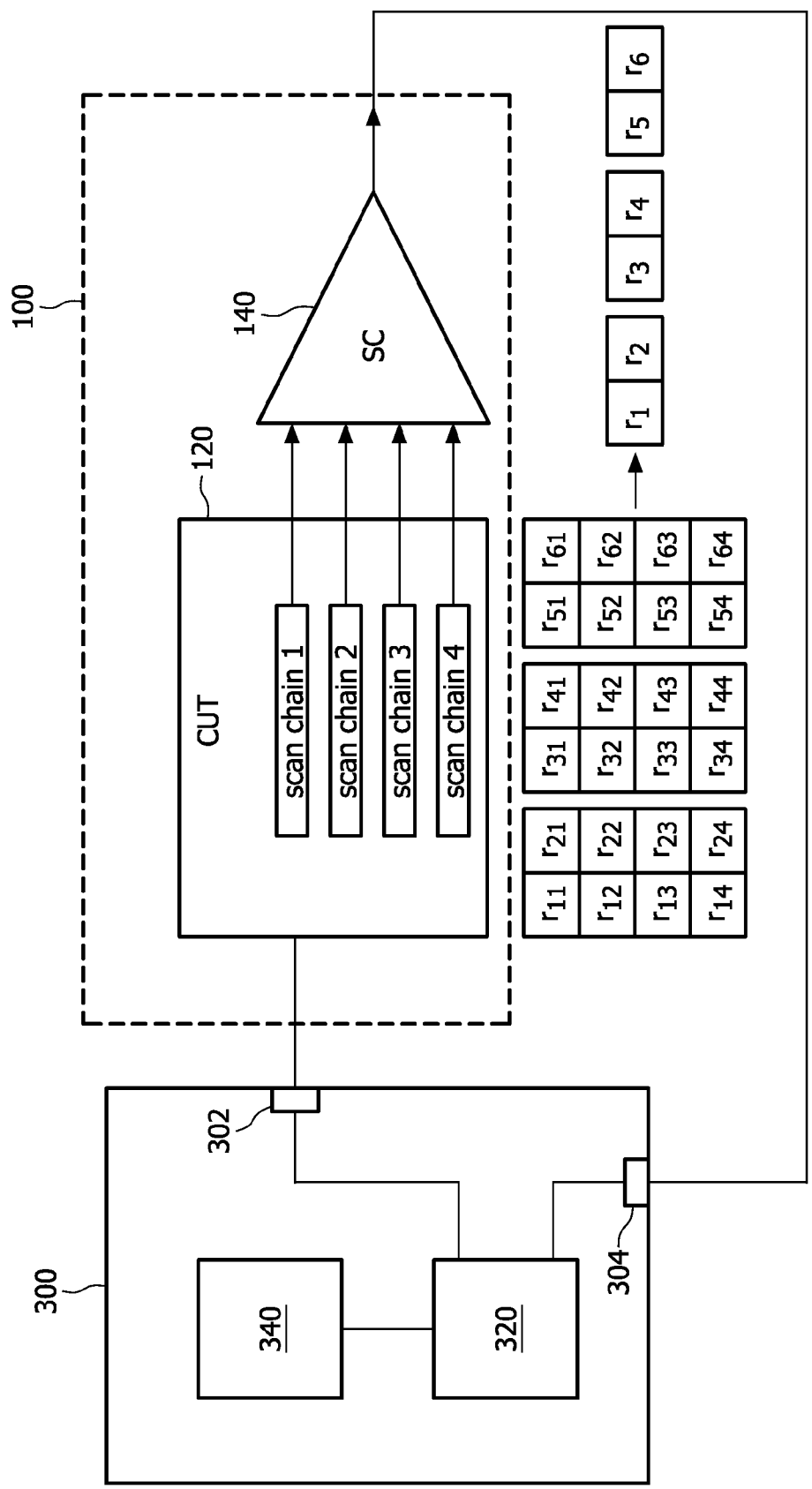
FIG. 3 depicts a test apparatus of the present invention.

Consequently, an IC 100 can be tested using said signature. In step 250, the integrated circuit is provided with a further plurality of test patterns, e.g. by a test apparatus as shown in FIG. 3, and in step 260, a plurality of compacted test responses to said further plurality of test patterns is received. This plurality of responses is checked for the presence of the signature as determined in step 240.

The test patterns applied in step 210 and 250 may be identical. Alternatively, the analysis leading to the definition of the fault signature may be used to modify the further plurality of test patterns, e.g. by limiting the number of bits in the fault signature as previously explained, or by removing those patterns that do not contribute to the fault signature.

FIG. 3 shows a test apparatus 300 according to the present invention. The apparatus 300 has an output 302 to provide test patterns to the IC 100. Preferably, the test patterns are in a compacted form, in which case the IC 100 comprises extraction logic (not shown). The apparatus 300 further comprises an input 304 for receiving the compacted test results from SCL 140. The test apparatus 300 has a controller 320, e.g. a central processing unit that controls the transmission of the test patterns to the CUT 120 and the evaluation of the compacted test results from the SCL 140. The controller 320 has access to a memory 340 in which the fault signature of a fault of the CUT 120 can be stored. This fault signature, which typically is generated in steps 210, 220 and 230 of the method of the present invention, as previously explained, may be provided to the test apparatus 300 by an external source, e.g. a computer on which the simulation has been performed. Alternatively, the apparatus 300 may be arranged to generate the fault signature internally, e.g. by storing appropriate instructions thereto in memory 340. The controller 320 is configured to evaluate the received test results to check for the presence of the fault signature therein.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method for locating a fault in an integrated circuit having a plurality of digital outputs coupled to compaction logic in a test mode of the integrated circuit, the compaction logic having at least one output for providing a test response, the method comprising:
providing a simulation model of the integrated circuit;
providing the simulation model with a plurality of test patterns;
receiving a plurality of simulated test responses to said test patterns;
defining a plurality of bits in the plurality of simulated test responses, said bits defining a signature of the fault;
providing the integrated circuit with a further plurality of test patterns;
receiving a plurality of test responses, including the test response provided by said at least one output of the compaction logic, to said further plurality of test patterns; and
checking the plurality of test responses for the presence of the signature.

2. A method as claimed in claim 1, wherein the plurality of test patterns and the further plurality of test patterns are identical.

3. The method of claim 1, wherein defining a plurality of bits that define the signature of the fault includes identifying all observation bits for the fault in each of the plurality of test patterns.

4. The method of claim 1, wherein the plurality of bits that define the signature of the fault include an odd number of all observation bits for the fault.

5. The method of claim 1, wherein the further plurality of test patterns include only test patterns of the first mentioned plurality of test patterns which contribute to the signature of the fault.

6. The method of claim 1, wherein the further plurality of test patterns identify at least a second fault in addition to the first mentioned fault, the first mentioned fault and second fault being identifiable in different scan cycles.

7. The method of claim 1, further comprising providing a fault isolation limit for the number of bits in the signature of the fault.

8. A method for locating a fault in an integrated circuit having a plurality of digital outputs coupled to compaction logic in a test mode of the integrated circuit, the compaction logic having at least one output for providing a test response, the method comprising:
providing a simulation model of the integrated circuit;
providing the simulation model with a plurality of test patterns;
receiving a plurality of simulated test responses to said test patterns;
defining a plurality of bits in the plurality of simulated test responses, said bits defining a signature of the fault;
providing the integrated circuit with a further plurality of test patterns;
receiving a plurality of test responses, including the test response provided by said at least one output of the compaction logic, to said further plurality of test patterns;
checking the plurality of test responses for the presence of the signature; and
setting an upper limit for the number of bits defining the signature.

9. A method as claimed in claim 8, further comprising restricting the number of test patterns in the further plurality such that said upper limit is not exceeded.

10. A method for locating a fault in an integrated circuit having a plurality of digital outputs coupled to compaction logic in a test mode of the integrated circuit, the compaction logic having at least one output for providing a test response, the method comprising:
providing a simulation model of the integrated circuit;
providing the simulation model with a plurality of test patterns;
receiving a plurality of simulated test responses to said test patterns;
defining a plurality of bits in the plurality of simulated test responses, said bits defining a signature of the fault;
providing the integrated circuit with a further plurality of test patterns;
receiving a plurality of test responses, including the test response provided by said at least one output of the compaction logic, to said further plurality of test patterns;
checking the plurality of test responses for the presence of the signature; and
defining the further plurality of test patterns from the plurality of test patterns by removing those test patterns from the plurality of test patterns that do not comprise a bit from the plurality of bits.

11. The method of claim 10, further comprising providing a fault isolation limit for the number of bits in the signature of the fault.

12. A test apparatus for testing an integrated circuit having a plurality of digital outputs coupled to compaction logic in a test mode of the integrated circuit, the compaction logic having at least one output for providing a test response, the test apparatus comprising:
- means for providing the integrated circuit with a plurality of test patterns;
- means for receiving a plurality of test responses, including the test response provided via said at least one output from the compaction logic, to said plurality of test patterns from the compaction logic;
- means for storing a signature of a fault of the integrated circuit, said signature being defined by a plurality of bits in the plurality of responses; and
- means for checking the test responses for the presence of the signature.

13. A test apparatus as claimed in claim 12, wherein the means for providing the integrated circuit with a plurality of test patterns are arranged to provide the test patterns in a compressed form.

14. A test apparatus for testing an integrated circuit having a plurality of digital outputs coupled to compaction logic in a test mode of the integrated circuit, the compaction logic including at least one output for providing a test response, the test apparatus comprising:
- a data storage circuit configured and arranged to store a signature of a fault of the integrated circuit;
- at least one circuit configured and arranged to
  - provide the integrated circuit with a plurality of test patterns,
  - receive a plurality of test responses to said plurality of test patterns from the compaction logic, the signature being defined by a plurality of bits in the plurality of test responses; and
  - check the test responses for the presence of the signature.

15. A test apparatus as claimed in claim 14, wherein the plurality of test patterns and the plurality of test responses are identical.

16. The test apparatus of claim 14, wherein a fault isolation limit restricts the plurality of bits defining the signature of the fault.

17. A test apparatus for testing an integrated circuit having a plurality of digital outputs coupled to compaction logic in a test mode of the integrated circuit, the compaction logic including at least one output for providing a test response, the test apparatus comprising:
- a data storage circuit configured and arranged to store a signature of a fault of the integrated circuit;
- at least one circuit configured and arranged to
  - provide the integrated circuit with a plurality of test patterns,
  - receive a plurality of test responses to said plurality of test patterns from the compaction logic, the signature being defined by a plurality of bits in the plurality of test responses; and
  - check the test responses for the presence of the signature wherein an upper limit for the number of bits defining the signature is set.

18. A test apparatus as claimed in claim 17, wherein the number of provided test patterns is restricted such that said upper limit is not exceeded.

19. A test apparatus for testing an integrated circuit having a plurality of digital outputs coupled to compaction logic in a test mode of the integrated circuit, the compaction logic including at least one output for providing a test response, the test apparatus comprising:
- a data storage circuit configured and arranged to store a signature of a fault of the integrated circuit;
- at least one circuit configured and arranged to
  - provide the integrated circuit with a plurality of test patterns,
  - receive a plurality of test responses to said plurality of test patterns from the compaction logic, the signature being defined by a plurality of bits in the plurality of test responses; and
  - check the test responses for the presence of the signature, and wherein the plurality of test responses from the plurality of test patterns are defined and based on removal of those test responses from the plurality of test responses that do not include a bit from the plurality of bits.

20. The test apparatus of claim 19, wherein a fault isolation limit restricts the plurality of bits defining the signature of the fault.

* * * * *